Figure 1:
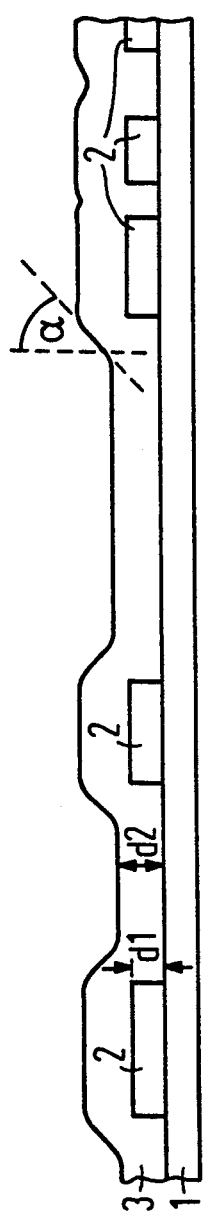

United States Patent [19]

Grewal et al.

[11] Patent Number: 5,212,114

[45] Date of Patent: May 18, 1993

[54] PROCESS FOR GLOBAL PLANARIZING OF SURFACES FOR INTEGRATED SEMICONDUCTOR CIRCUITS

[75] Inventors: Virinder-Singh Grewal, Ebersberg; Klaus-Dieter Menz, Munich; Ronald Huber, Hohenbrunn, all of Fed. Rep. of Germany

[73] Assignee: Siemens Aktiengesellschaft, Munich, Fed. Rep. of Germany

[21] Appl. No.: 580,329

[22] Filed: Sep. 10, 1990

[30] Foreign Application Priority Data

Sep. 8, 1989 [EP] European Pat. Off. ........... 89116664

[51] Int. Cl.$^5$ ..................... H01L 21/88; H01L 21/302
[52] U.S. Cl. ..................................... 437/192; 437/193; 437/195; 437/228; 437/231
[58] Field of Search ................. 437/192, 193, 200, 228

[56] References Cited

U.S. PATENT DOCUMENTS

| | | | |
|---|---|---|---|
| 4,038,110 | 7/1977 | Feng | 437/228 |
| 4,662,064 | 5/1987 | Hsu et al. | |
| 4,954,459 | 9/1990 | Avanzino et al. | 437/228 |
| 5,015,602 | 5/1991 | Van Der Plas et al. | 437/67 |

FOREIGN PATENT DOCUMENTS

| | | | |
|---|---|---|---|
| 0216425 | 4/1987 | European Pat. Off. | 437/228 |
| 0312154 | 4/1989 | European Pat. Off. | |
| 2340442 | 2/1975 | Fed. Rep. of Germany | 437/228 |
| 61-287245 | 12/1986 | Japan | 437/228 |
| 62-018054 | 1/1987 | Japan | 437/228 |
| 63-131546 | 6/1988 | Japan | 437/228 |
| 64-066939 | 3/1989 | Japan | 437/228 |
| 1-94623 | 4/1989 | Japan | 437/228 |
| 1-108725 | 4/1989 | Japan | 437/228 |
| 1-209727 | 8/1989 | Japan | 437/228 |
| 1-212439 | 8/1989 | Japan | 437/228 |
| 2-180052 | 7/1990 | Japan | 437/228 |

OTHER PUBLICATIONS

Kawai, et al. "Interlayered Dielectric Planarization with TEOS-CVD and SOG", V-MIC Conf., Jun. 13-14, 1988, pp. 419-425.

Bartush, et al., "Dielectric Isolation Planarzation", IBM Tech. Disclosure Bull., vol. 21, No. 5 (Oct. 1978).

Sheldon, et al., "Application of a 2-Layer Planarization Process . . . ", IEEE Transactions on Semiconductor Manufacturing, vol. 1, No. 4, Nov. 1988 pp. 140-145.

Moss, et al., Eds. "*The Chemistry of the Semiconductor Industry*", Blackie, London, pp. 375-376 (date unknown).

Adams, et al. "Planarization of P-Doped SiO$_2$" *J. Electrochem. Soc.*, Feb. 1981 pp. 423-429.

Spindler, et al., "Trends and New Applications in Thin Films" (TATF 89/Reg. No. 48) Siemens AG Munich, Feb./Mar. 1989.

*Primary Examiner*—Olik Chaudhuri
*Assistant Examiner*—Ken Horton
*Attorney, Agent, or Firm*—Herbert L. Lerner; Laurence A. Greenberg

[57] ABSTRACT

In a process for global planarizing of surfaces for integrated semiconductor circuits a locally planarized insulation layer of silicon oxide with one thickness is initially applied on a structured layer to be planarized having another thickness. Photoresist structures are generated thereon as an auxiliary plane inversely to the structured plane lying below. A further well-adhering and planarizing auxiliary layer, preferably formed of spin-on glass, is applied. It must be selected as a function of a following anisotropic back-etching, in such a way that its etching rate is greater than that of the photoresist layer and nearly the same as that of the silicon oxide layer. The photoresist structures remaining after the back etching are removed. A further insulating layer formed of silicon oxide is applied up to the selected insulator thickness. The process is characterized by uncritical, well controllable process steps in contemporary technology and is usable in highly integrated circuits with a plurality of metallizing planes as well as in simple component structures.

11 Claims, 1 Drawing Sheet

PROCESS FOR GLOBAL PLANARIZING OF SURFACES FOR INTEGRATED SEMICONDUCTOR CIRCUITS

The invention relates to a global planarizing process for surfaces of integrated circuits, in which a locally planarized oxide film is etched back by using a photographic technique and a planarizing auxiliary layer.

A similar process can be learned, for instance, from a report by D. J. Sheldon et al in IEEE Transactions on Semiconductor Manufacturing, Vol. 1, No. 4, November 1988, pp. 140–145, in which photoresist is used as the planarizing auxiliary layer.

The ever-increasing scale of integration in VLSI circuits (Very Large Scale Integrated circuits) increasingly requires global planarizing. With an increasing number of planes being used, the steps to be planarized increase markedly, among other effects, which causes separation or short-circuiting in the metallizing, and depth of focus problems in wafer steppers used therein.

Heretofore there has been no process suitable for production through which planarizing extending over the entire wafer/chip surface (i.e., global planarizing) could be performed.

Aside from the photoresist technique mentioned above (the Sheldon report), planarizing processes for phosphorous-doped silicon oxide films with auxiliary layers of positive photoresist, for example, and back-etching, are known from a report by A. C. Adams and C. D. Capio from J. Electrochem. Soc.: Solid State Science and Technology, February 1981, pp. 423–429. Although such processes produce good planarizing results, they do not achieve global planarizing. Typical decay lengths for such resist back-etching techniques are on the order of 10 μm.

The same applies to a planarizing process of the kind introduced by O. Spindler and B. Neureither on a poster at the DAGV meeting entitled "Trends and New Applications in Thin Films (TATF)", February 27–Mar. 3, 1989 in Regensburg, Germany, published in "Thin Films", October 1989. The planarizing process shown there, using a "Precision 5000" from Applied Materials ("AMT Precision 5000"), with which deposition and back-etching of silicon oxide are performed in the same system, produces decay lengths of 4 μm.

A global planarizing process that is based on mechanical grinding of oxide films which is also known, requires an additional grinder. Planarizing methods that use additional dummy metal or oxide tracks are also known.

Finally, spin-on glass is known as a material for planarizing processes, from a report by M. Kawai et al from the conference proceedings of the V-MIC conference on Jun. 13 and 14, 1988, pp. 419–425.

It is accordingly an object of the invention to provide a process for global planarizing of surfaces for integrated semiconductor circuits, which overcomes the hereinafore-mentioned disadvantages of the heretofore-known methods of this general type and which enables global planarizing to be performed using known, time-tested production equipment.

With the foregoing and other objects in view there is provided, in accordance with the invention, a global planarizing process for surfaces of integrated circuits, which comprises:

a) preparing a component finished down to a substrate plane, and a structured layer to be planarized being disposed above the substrate plane and having a given step height and a structure-defining plane defining regions covered by and regions not covered by the structure-defining plane;

b) initially producing a locally planarized silicon oxide film defining oxide trenches with a given width and having a remaining silicon oxide thickness over all of the regions not covered by the structure-defining plane being greater than the given step height after the local planarizing;

c) generating photoresist structures with a photographic technique inversely to the locally planarized plane of the structured layer having widths being less than the given width of the oxide trenches;

d) applying a well-adhering planarizing auxiliary layer to the photoresist structures and the silicon oxide film being selected as a function of a subsequent anisotropic back-etching with an etching rate being greater than that of the photoresist structures and approximately equal to that of the silicon oxide film;

e) anisotropically back-etching with a removal thickness leaving an oxide surface on regions of the structured layers approximately corresponding to the level of non-back-etched silicon oxide film under the surfaces of the photoresist structures; and f) removing the photoresist and then removing residues of the auxiliary layer by re-etching the surface with isotropic etching after the removal of the resist and additionally removing a damage layer produced by the anisotropic etching.

The combination of these individual process steps permits good manufacturability without major expense for inspection.

The process taught by the invention makes it possible to produce VLSI semiconductor circuits with many structuredefining planes.

In accordance with another mode of the invention, there is provided a process which comprises producing the structured planes to be planarized as a metallizing plane or a polycrystalline silicon plane, and applying a silicon oxide film to a desired insulator thickness following step f).

However, in accordance with a further mode of the invention, there is provided a process which comprises producing the structured plane to be planarized as a substrate plane having a surface with trenches formed therein (a so-called shallow trench plane), performing the thickness removal in the anisotropic back-etching far enough to etch-free the surfaces of the structure, and dispensing with the ensuing re-etching.

In accordance with an added mode of the invention, there is provided a process which comprises precipitating insulation layers including silicon oxide from the gas phase by a plasma-reinforced process.

In accordance with an additional mode of the invention, there is provided a process which comprises producing the well-adhering and planarizing auxiliary layer from spin-on glass applied by spinning onto the layers.

In accordance with yet an another mode of the invention, there is provided a process which comprises performing the anisotropic back-etching step with etching selectivities of spin-on glass to plasma oxide to photoresist in a proportion of substantially 1 to 0.8–1.2 to greater than 1.5.

In accordance with yet a concomitant mode of the invention, there is provided a process which comprises performing the etching process using a gas selected from the group consisting of trifluoromethane (CHF$_3$) and oxygen and argon.

Other features which are considered as characteristic for the invention are set forth in the appended claims.

Although the invention is illustrated and described herein as embodied in a process for global planarizing of surfaces for integrated semiconductor circuits, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

FIGS. 1–5 are fragmentary, diagrammatic, sectional views which illustrate essential process steps of the invention, for a planarizing process of a structure-defining plane performed with plasma oxide.

Referring now in detail to the figures of the drawings in which identical elements are provided with the same reference numerals and first, particularly, to FIG. 1 thereof, it is seen that reference numeral 2 identifies a structured layer which may, for instance, include aluminum, that is located on a substrate plane 1 and is to be insulated and planarized. The local planarization can, for instance, be achieved, by using the aforementioned AMT Precision 5000 system, as follows:

1) depositing a full-surface conformal film of silicon oxide in the plasma by decomposition of tetraethyl orthosilicate;
2) etching in order to bevel the oxide edges;
3) depositing a second oxide;
4) back-etching the oxide to a set-point thickness.

The result of this process sequence is an oxide 3. A remaining silicon oxide thickness d2 after the local planarization must be greater, over all of the regions not covered by the structure-defining plane, than a step height d1 of the structure 2. An edge angle $\alpha$ shown in the drawing is a measure of the planarizing attained.

Figure 2:
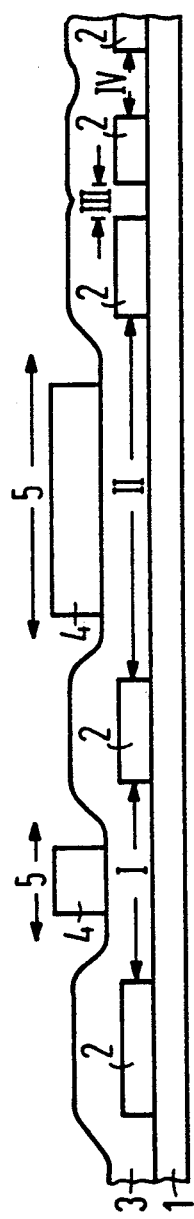

According to FIG. 2, photoresist structures 4 are then produced inversely to the locally planarized plane of the structure 2. In an anisotropic etching, which will be described in greater detail below with regard to FIG. 4, they serve to mask the oxide located deep in trenches 5. Care must be taken to ensure that because of the local planarizing, seen in FIG. 1, resist coverage in narrow gaps, such as those at III and IV, must not occur, in contrast to wider gaps I and II. In calculating the critical gap width beyond which a resist coverage does take place, the following factors are considered, among others: structure thickness, oxide thickness remaining after the local planarization, edge angle $\alpha$, minimum width of the resist structures 4, and adjusting and dimensional tolerances of the technology being used. Through the use of a suitable correction factor in the photoresist technique for the structure 4, it is assured that the resist does not cover the oxide edges. Otherwise, oxide humps would remain behind after the anisotropic back-etching. The correction factor is calculated from the same technical factors mentioned above.

Gaps that are not filled as a result of the local planarizing but are below the critical gap width are maximally planarized by the ensuing planarization seen in FIG. 4. For typical 1 $\mu$m CMOS logic processes, using local planarizing with the Precision 5000 system, critical gap widths in the range of 5 $\mu$m are to be expected in metallizing planes.

Figure 3:
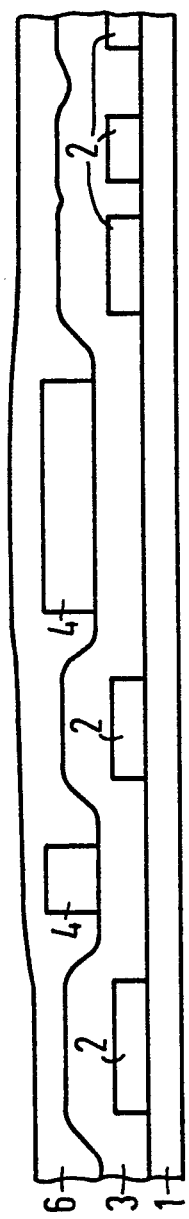

A seen in FIG. 3, after the production of the photoresist structures or tracks or paths 4, a well-adhering and planarizing auxiliary layer 6, which may include spin-on glass, is applied. If this auxiliary layer is not formed of spin-on glass, then when some other material is selected, care must also be taken to ensure that the etching rate of the auxiliary layer as a function of the ensuing anisotropic back-etching, is greater than that of the photoresist structure 4 and approximately equal to that of the silicon oxide film 3.

Figure 4:

According to FIG. 4, the succession of layers thus obtained is then etched back anisotropically, for example in an "AME-HEX" multi-disk etching system (made by Applied Materials Equipment), far enough to ensure that the oxide surface on the structure regions 2 is virtually equivalent to the level of the non-back-etched oxide under the surfaces of the resist structures 4. Such etching can, for instance, be done with fixed time (no endpoint recognition). As a result of the virtually identical etching rates of the oxide film 3 and an auxiliary layer 7 and the lower etching rates of the resist structure 4, photoresist residues still remain after the back-etching. The anisotropic etching is preferably performed by trifluoromethane and oxygen and/or argon.

Figure 5:
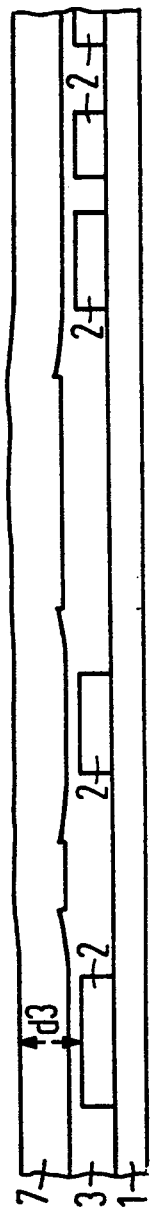

As seen in FIG. 5, after the removal of the photoresist, for instance by resist incineration in a barrel or downstream incinerator, the surface which is then resist-free is re-etched. The re-etching, which is a wet or dry isotropic etching process, serves to remove both any residues of the auxiliary layer still remaining and the damage layer that the anisotropic etching had produced. The amount of the oxide film 3 being removed is typically less than 50 nm, for example. Finally, the auxiliary or further silicon oxide layer 7 is deposited, in order to achieve an intended thickness d3 specified by the technology. In the case of trench planarization, the re-etching seen in FIG. 4 and the deposition of the isolation oxide are dispensed with.

We claim:

1. Process for globally planarizing surfaces of integrated circuits, which comprises:
   a) preparing a component with a substrate plane, and a structured layer to be planarized being disposed above the substrate plane and having a given step height for defining regions of the substrate plane covered by and regions not covered by the structured layer;
   b) initially producing a locally planarized silicon oxide film defining oxide trenches having a remaining silicon oxide thickness over all of the regions not covered by the structured layer being greater than the given step height after the local planarizing;
   c) generating photoresist structures with a photographic technique inversely to the locally planarized plane of the structured layer so that side walls of the oxide trenches are not covered by the photoresist structures;
   d) applying a well-adhering planarizing auxiliary layer to the photoresist structures and the silicon oxide film, the auxiliary layer being formed of a different material than the photoresist structures;
   e) anisotropically back-etching with substantially corresponding etch rates of the auxiliary layer and the silicon oxide and a lower etch rate of the photoresist structures until the level of the silicon oxide on the structured layers is approximately equal to the level of nonback-etched silicon oxide film under the surfaces of the photoresist structures;

f) removing the photoresist; and g) removing residues of the auxiliary layer and additionally removing a damage layer produced by the anisotropic etching with an isotropic etching process.

2. Process according to claim 1, which comprises producing the structured layer to be planarized as a metallization, and applying a silicon oxide film to a desired insulator thickness after step f).

3. Process according to claim 2, which comprises producing the structured layer to be planarized as polycrystalline silicon layer, and applying a silicon oxide film to a desired insulator thickness after step f).

4. Process for globally planarizing surfaces of integrated circuits, which comprises:

a) preparing a component with a first substrate plane, and a structured layer to be planarized in the form of a second substrate plane above the first substrate plane having a surface with trenches formed therein and a given step height;

b) initially producing a locally planarized silicon oxide film defining oxide trenches having a remaining silicon oxide thickness at all oxide trenches being greater than the given step height after the local planarizing;

c) generating photoresist structures with a photographic technique inversely to the locally planarized plane of the structured layer such that side walls of the oxide trenches are not covered by the photoresist structures;

d) applying a well-adhering and planarizing auxiliary layer to the photoresist structures and the silicon oxide film, the auxiliary layer being formed of a different material than the photoresist structures;

e) anisotropically back-etching with substantially corresponding etch rates of the auxiliary layer and the silicon oxide and a lower etch rate of the photoresist structures with a removal thickness leaving the surfaces of the structured layers etched free; and f) removing the photoresist and then removing residues of the auxiliary layer.

5. Process according to claim 1, which comprises precipitating insulation layers including silicon oxide from the gas phase by a plasma-reinforced process.

6. Process according to claim 1, which comprises producing the well-adhering and planarizing auxiliary layer from spin-on glass applied by spinning onto the layers.

7. Process according to claim 4, which comprises producing the well-adhering and planarizing auxiliary layer from spin-on glass applied by spinning onto the layers.

8. Process according to claim 6, which comprises performing the anisotropic back-etching step with etching selectivities of spin-on glass to silicon oxide to photoresist in a proportion of substantially 1 to 0.8–1.2 to greater than 1.5.

9. Process according to claim 7, which comprises performing the anisotropic back-etching step with etching selectivities of spin-on glass to silicon oxide to photoresist in a proportion of substantially 1 to 0.8–1.2 to greater than 1.5.

10. Process according to claim 8, which comprises performing the etching process using a gas selected from the group consisting of trifluoromethane ($CHF_3$) and oxygen and argon.

11. Process according to claim 9, which comprises performing the etching process using a gas selected from the group consisting of trifluoromethane ($CHF_3$) and oxygen and argon.

* * * * *